United States Patent [19]

Murata et al.

[11] Patent Number: 5,576,229
[45] Date of Patent: Nov. 19, 1996

[54] METHOD OF FABRICATING A THIN-FILM TRANSISTOR AND LIQUID-CRYSTAL DISPLAY APPARATUS

[75] Inventors: Yasuaki Murata, Tenri; Atsushi Yoshinouci, Kashiba, both of Japan

[73] Assignee: Sharp Kabushiki Kaisha, Osaka, Japan

[21] Appl. No.: 454,868

[22] Filed: May 31, 1995

[30]   Foreign Application Priority Data

Aug. 30, 1994 [JP] Japan .................................. 6-205681

[51] Int. Cl.⁶ .............................................. H01L 21/266
[52] U.S. Cl. .............................. 437/40; 437/24; 437/933
[58] Field of Search .............................. 437/24, 40 TFT, 437/151, 933, 937; 148/DIG. 128, DIG. 151

[56]   References Cited

U.S. PATENT DOCUMENTS

| | | | |
|---|---|---|---|
| 5,250,446 | 10/1993 | Osawa et al. | 437/933 |
| 5,403,756 | 4/1995 | Yoshinouchi et al. | 437/24 |
| 5,504,020 | 4/1996 | Aomori et al. | 437/40 TFT |

FOREIGN PATENT DOCUMENTS

| | | |
|---|---|---|
| 63-194326 | 8/1988 | Japan . |
| 4-39967 | 2/1992 | Japan . |
| 5-243270 | 9/1993 | Japan . |
| 5-335334 | 12/1993 | Japan . |
| 6-37110 | 2/1994 | Japan . |

Primary Examiner—Chandra Chaudhari
Attorney, Agent, or Firm—David G. Conlin; George W. Neuner

[57]   ABSTRACT

A method of fabricating a thin-film transistor, includes the step of forming a source region and a drain region in a semiconductor thin film having a capping film thereon, by accelerating a plasma source including hydrogen ions and one of Group III ions and Group V ions of the Periodic table, and simultaneously implanting the hydrogen ions and one of the Group III ions and the Group V ions into the semiconductor thin film, wherein there exist a plurality of peaks in a depth profile of a concentration of the hydrogen ions implanted into the semiconductor thin film having the capping film thereon and a second peak from a surface of the capping film among the plurality of peaks is made to exist in the semiconductor thin film.

6 Claims, 10 Drawing Sheets

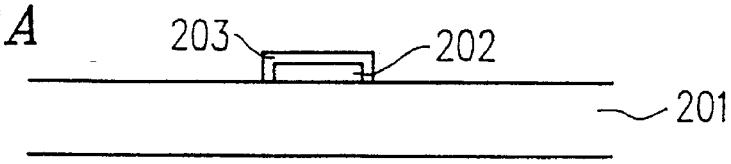
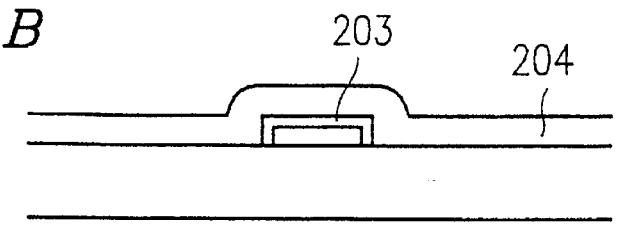
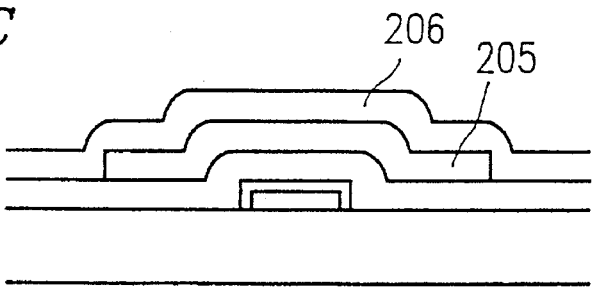
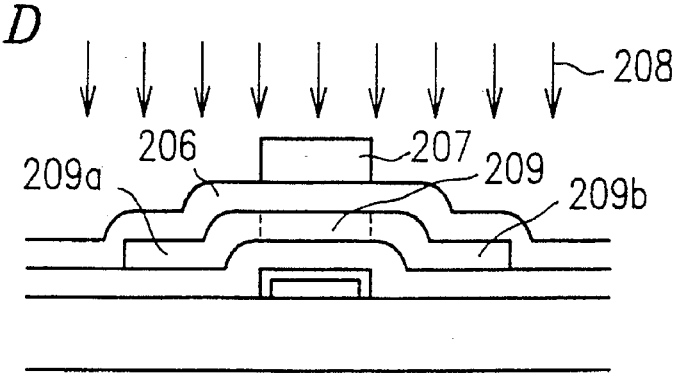
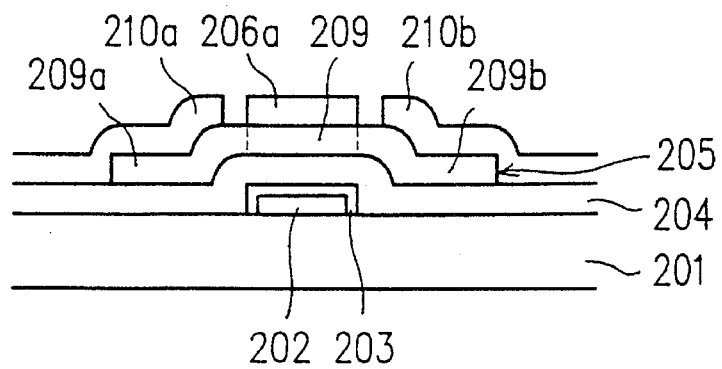

METHOD OF FABRICATING A THIN-FILM TRANSISTOR AND LIQUID-CRYSTAL DISPLAY APPARATUS

BACKGROUND OF THE INVENTION

1. Field of the Invention

The present invention relates to a method of fabricating a thin,film transistor used in a display apparatus such as a liquid-crystal display apparatus, and to a liquid-crystal display apparatus having TFTs fabricated using the method.

2. Description of the Related Art

The recent trend for display apparatus such as liquid-crystal display apparatus has been toward larger screen area and higher resolution. This trend has involved producing a larger-area glass substrate while making thin-film transistors (hereinafter referred to TFTs) even smaller. To fabricate TFTs on a low-cost, large-area glass substrate, low-temperature processing at 400° C. or lower is preferable. Currently, TFTs for this purpose are fabricated using thin films of amorphous silicon (a-Si) that can make thin films with good uniformity relatively easily at low temperatures. In the fabrication of such an a-Si TFT, the following two methods are known for forming source and drain regions: in one method, a $SiH_4$ gas containing an impurity gas such as a $PH_3$ gas is decomposed by discharge to deposit an $n^+$ a-Si film, thereby forming the source and drain regions; in the other method, a gas containing impurities such as a hydrogen diluted $PH_3$ gas is ionized by discharge, and the resulting ions are accelerated and implanted into the a-Si film without mass separation, to form a doped film such as an $n^+$ a-Si film, thereby forming the source and drain regions. This method is referred to as an ion shower doping method and explained in, for example, Japanese Patent Laid-Open Publication Nos. 63-194326, 4-39967, 5-243270, and 6-37110.

However, the resistivity of the source and drain regions ($n^+$ a-Si film) formed by the above two conventional methods is as high as $10^3$ $\Omega \cdot cm$, which leads to degradation of transistor characteristics.

The present invention overcomes the aforementioned problems associated with the conventional methods, and provides a method of fabricating a TFT having source and drain regions of a low resistance, and also provides a liquid-crystal display apparatus that uses such TFTs in its display panel and that can provide a larger-area, higher-resolution screen.

SUMMARY OF THE INVENTION

The method of fabricating a thin-film transistor of the invention includes the step of: forming a source region and a drain region in a semiconductor thin film having a capping film thereon by accelerating a plasma source including hydrogen ions and one of Group III ions and Group V ions of the Periodic table, and simultaneously implanting the hydrogen ions and one of the Group III ions and the Group V ions into the semiconductor thin film, wherein there exist a plurality of peaks in a depth profile of a concentration of the hydrogen ions implanted into the semiconductor thin film having the capping film thereon and a second peak from a surface of the capping film among the plurality of the peaks is made to exist in the semiconductor thin film.

In one embodiment of the invention, material and a thickness of the capping film are selected in relation to ion implantation acceleration energy so that the second peak exists in the semiconductor thin film.

In another embodiment of the invention, an acceleration energy for accelerating the plasma source is determined such that the second peak exists in the semiconductor thin film.

In still another embodiment of the invention, the semiconductor thin film includes a silicon film having a microcrystalline phase.

In still another embodiment of the invention, the thin-film transistor is a reverse-staggered thin-film transistor, and an insulating protective film for the semiconductor thin film is used as the capping film.

In still another embodiment of the invention, the thin-film transistor is a staggered or coplanar thin-film transistor, and a gate insulating film is used as the capping film.

According to another aspect of the invention, a liquid-crystal display apparatus includes a thin-film transistor. The thin-film transistor having a source region and a drain region in a semiconductor thin film having a capping film thereon, prepared by accelerating a plasma source including hydrogen ions and one of Group III ions and Group V ions of the Periodic table, and simultaneously implanting the hydrogen ions and one of the Group III ions and the Group V ions into the semiconductor thin film, wherein there exist a plurality of peaks in a depth profile of a concentration of the hydrogen ions implanted into the semiconductor thin film having the capping film thereon and a second peak from a surface of the capping film among the plurality of the peaks is located in the semiconductor thin film.

According to the present invention, Group III ions and hydrogen ions, or alternatively, Group V ions and hydrogen ions, are simultaneously implanted into the semiconductor thin film in such a manner that the second peak of depth profile of the implanted hydrogen ions appears within the semiconductor thin film, making it possible to produce low-resistance source and drain regions. This realizes the fabrication of a TFT having a high field-effect mobility and contributes to reducing the TFT size. Furthermore, since an insulating film, such as a silicon oxide film or a silicon nitride film, can be used as the capping film, the insulating protective film or the gate insulating film that forms inherent part of the TFT can be used to function as the capping film, which makes it easy to fabricate a high-performance TFT.

When such TFTs are used in the display panel of a liquid-crystal display, the greater field-effect mobility and smaller size of the TFT contributes to improving the numerical aperture, achieving a high-resolution, large-area bright screen.

Thus, the invention described herein makes possible the advantages of (1) providing a TFT having a high field-effect mobility and (2) providing a liquid-crystal display apparatus having larger-area bright screen with high-resolution.

These and other advantages of the present invention will become apparent to those skilled in the art upon reading and understanding the following detailed description with reference to the accompanying figures.

BRIEF DESCRIPTION OF THE DRAWINGS

FIGS. 2A to 2E are cross-sectional views illustrating a fabrication process sequence for a TFT according to a first embodiment of the present invention.

DESCRIPTION OF THE PREFERRED EMBODIMENTS

The inventors have discovered that a semiconductor thin film having low resistivity is obtained by simultaneously implanting Group III ions and hydrogen ions, or alternatively, Group V ions and hydrogen ions into a semiconductor thin film having a capping film thereon such that there exist a plurality of peaks in a depth profile of a concentration of the hydrogen ions implanted into the semiconductor thin film and that a second peak from a surface of the capping film among the plurality of the peaks is made to exist in the semiconductor thin film.

Figure 1:
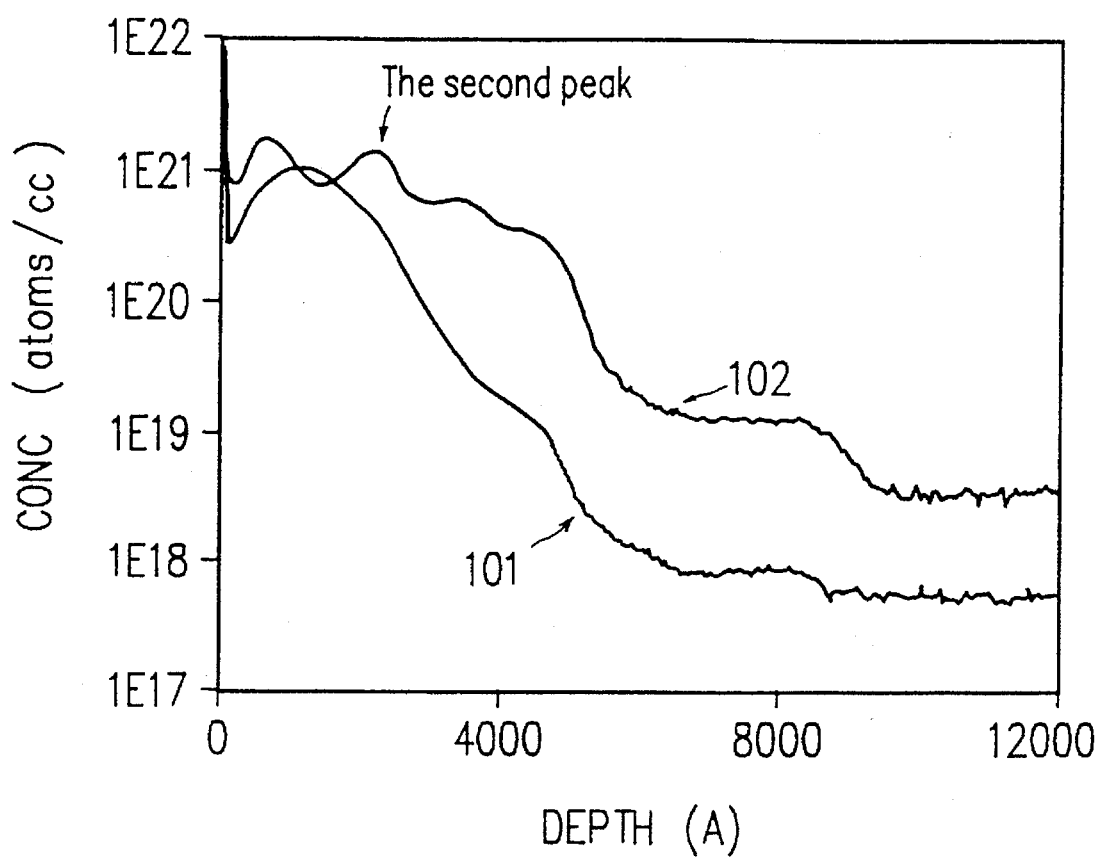
FIG. 1 is a graph showing results of a SIMS analysis for phosphorous ions and hydrogen ions implanted into a silicon substrate by the ion implantation apparatus shown in FIG. 3.

In the present invention, the second peak of the depth profile of hydrogen atoms refers to the second peak appearing in the hydrogen atom concentration distribution 102 shown in FIG. 1, as counted from the film surface (the left edge of the figure). FIG. 1 is a graph showing the results of SIMS (secondary ion mass spectroscopy) measurements of ions of a 5% hydrogen diluted $PH_3$ gas decomposed by discharge and simultaneously implanted into a c-Si wafer substrate at an acceleration voltage of 100 kV. In the figure, the depth below the film surface is plotted along the abscissa and the atom concentration in the film along the ordinate, and reference numeral 101 indicates the concentration distribution of phosphorus atoms. There occur about five peaks in the hydrogen atom concentration distribution 102. This is because when the 5% hydrogen diluted $PH_3$ gas is decomposed by discharge, $PH_x^+$ (X=1 to 3), $H^+$, and $H_2^+$ are generated, and when these ions are accelerated by an electric field, various energies are imparted to the hydrogen ions. A peak may be observed at the film surface due to, for example, an error in SIMS measurement, but this peak is not counted in the number of peaks. In the invention, for convenience of analysis by SIMS, measurements were made using a c-Si wafer substrate, but if a silicon oxide film is used, differences in the ion projected range will be only about 5% and displacements of the peaks will fall within the allowable range, therefore, the measurements will be applicable without correction.

Furthermore, in the present invention, silicon containing a microcrystalline phase (microcrystalline Si) refers to one having a resistivity of $2\times10^9\Omega\cdot$cm or less, a bonded hydrogen quantity of 10 atomic percent or less, a crystal grain diameter of 100 nm or less, and a crystal volume percent of 10% or more. The following methods are available for confirming microcrystalline Si:

(1) A method in which the presence of microcrystalline Si is confirmed using a technique of reflected electron diffraction.

(2) A method in which in Raman spectroscopy the Raman spectrum is divided into a broad peak unique to a-Si near 480 cm$^{-1}$ and a peak unique to crystalline Si of 520 cm$^{-1}$ and the crystal volume percent representing the proportion of crystals in the microcrystalline Si film is obtained from the integrated intensity ratio of each peak.

(3) A method in which the integrated value of a peak near 2000 cm$^{-1}$, representing Si—H bonding, is measured by infrared absorption spectrum to determine the bonded hydrogen quantity contained in the film.

According to the invention, by ion implantation, the crystal phase in the semiconductor film is amorphized at the early stage of the implantation, but as the dose increases, crystallization occurs again with the remaining crystal phase as the nucleus. This crystallization is accelerated by the hydrogen ions, and during this process, the impurity ions are activated. Therefore, the second peak appearing in a depth profile of the concentration of the hydrogen atoms implanted into the semiconductor thin film is made to locate within the semiconductor film so that hydrogen concentration increases at the semiconductor thin film.

Additionally, in the case of an amorphous semiconductor film, there are no nuclei in the film for crystallization, so that little crystallization occurs and a low-resistance film cannot be obtained. Thus, it is also apparent from the above explanation that a microcrystalline silicon film is desirable as the semiconductor thin film.

Generally, when the ion acceleration voltage is increased, the peak position moves farther away from the film surface; conversely, when the acceleration voltage is decreased, the peak position moves nearer to the film surface. Accordingly, by adjusting the thickness of the capping film in relation to the acceleration voltage, the second peak of hydrogen atoms can be made to exist within the semiconductor thin film. Furthermore, the projected range of hydrogen ions for the same acceleration voltage varies depending on the kind of the capping film, which therefore changes the position of the second peak of hydrogen atoms. In this case, by selecting the kind of the capping film in relation to the acceleration voltage, the second peak of hydrogen atoms can be made to exist within the semiconductor thin film.

An insulating film, such as a silicon oxide film or a silicon nitride film, can be used as the capping film; therefore, when fabricating a TFT having a gate electrode, gate insulating film, semiconductor thin film, and insulating protective film formed sequentially in this order on the substrate, as in a reverse-staggered TFT, the insulating protective film can be used as the capping film. Likewise, when fabricating a TFT having a semiconductor thin film, gate insulating film, and gate electrode formed sequentially in this order on the substrate, as in a staggered TFT or a coplanar TFT, the gate insulating film can be used as the capping film. In either case, an extra deposition step for forming the capping film is not needed.

Since the resistance of the source and drain regions of the thus fabricated TFTs is low, high mobility is expected and a reduction in TFT size can be achieved. When such TFTs are used in the display panel of a liquid-crystal display, the numerical aperture can be improved by the smaller size and greater mobility of the TFTs, and a high-resolution, bright screen can be obtained.

(Embodiment 1)

FIG. 2E shows a cross-sectional view of a reverse-staggered TFT fabricated by using a TFT fabrication method according to a first embodiment of the present invention. This TFT has a gate electrode 202 formed on a substrate 201, the entire surface of the gate electrode 202 being covered with an anodic oxide film 203. Formed thereon is a gate insulating film 204 on top of which a microcrystalline silicon film 205 is formed. The microcrystalline silicon film 205 consists of a source region 209a and a drain region 209b doped with impurity ions and a channel region 209 not doped with impurity ions. The channel region 209 is interposed between the source region 209a and the drain region 209b and formed opposite the gate electrode 202.

An insulating protective film 206a is formed above the channel region 209, while a source electrode 210a and a drain electrode 210b are formed on the source region 209a and the drain region 209b, respectively.

This TFT can be fabricated in accordance with the fabrication process sequence shown in FIGS. 2A to 2E.

First, as shown in FIG. 2A, a thin film of metal such as tantalum is deposited over the substrate 201 formed from a transparent glass substrate or the like, and the deposited film is patterned by photolithography in a desired shape to form the gate electrode 202. The anodic oxide film 203 is formed by anodic-oxidizing the gate electrode 202.

Next, as shown in FIG. 2B, an insulating film such as a silicon nitride film or a silicon oxide film is deposited by plasma CVD (chemical vapor deposition) or by sputtering, to form the gate insulating film 204.

As shown in FIG. 2C, a microcrystalline silicon film is deposited to a thickness of about 600 Å by plasma CVD with high RF power using a hydrogen diluted monosilane gas ($H_2/SiH_4$=10 to 100), and the deposited film is patterned by photolithography in a desired shape to form the microcrystalline silicon film 205.

A silicon oxide film or the like is deposited over the entire structure by plasma CVD or by sputtering, to form a capping layer 206 having a thickness of 2000 Å.

Next, as shown in FIG. 2D, a resist film (not shown) is applied uniformly over the capping film 206 by spin coating. Using the gate electrode 202 as a mask, the resist film is patterned by back surface exposure, i.e., exposure to light projected from the back surface of the substrate 201, to form a resist pattern 207.

After that, phosphorus ions and hydrogen ions 208 are simultaneously implanted, at an acceleration voltage of 100 kV and a total dose of $2\times10^{16}$ ions/cm$^2$, through the capping film 206 and into the microcrystalline silicon film 205, thereby forming the source region 209a and drain region 209b of n-type semiconductor layers in self-alignment with the resist pattern 207. At this time, impurities are not doped into the portion of the microcrystalline silicon film vertically beneath the resist pattern 207; this portion acts as the channel region 209.

Figure 3:
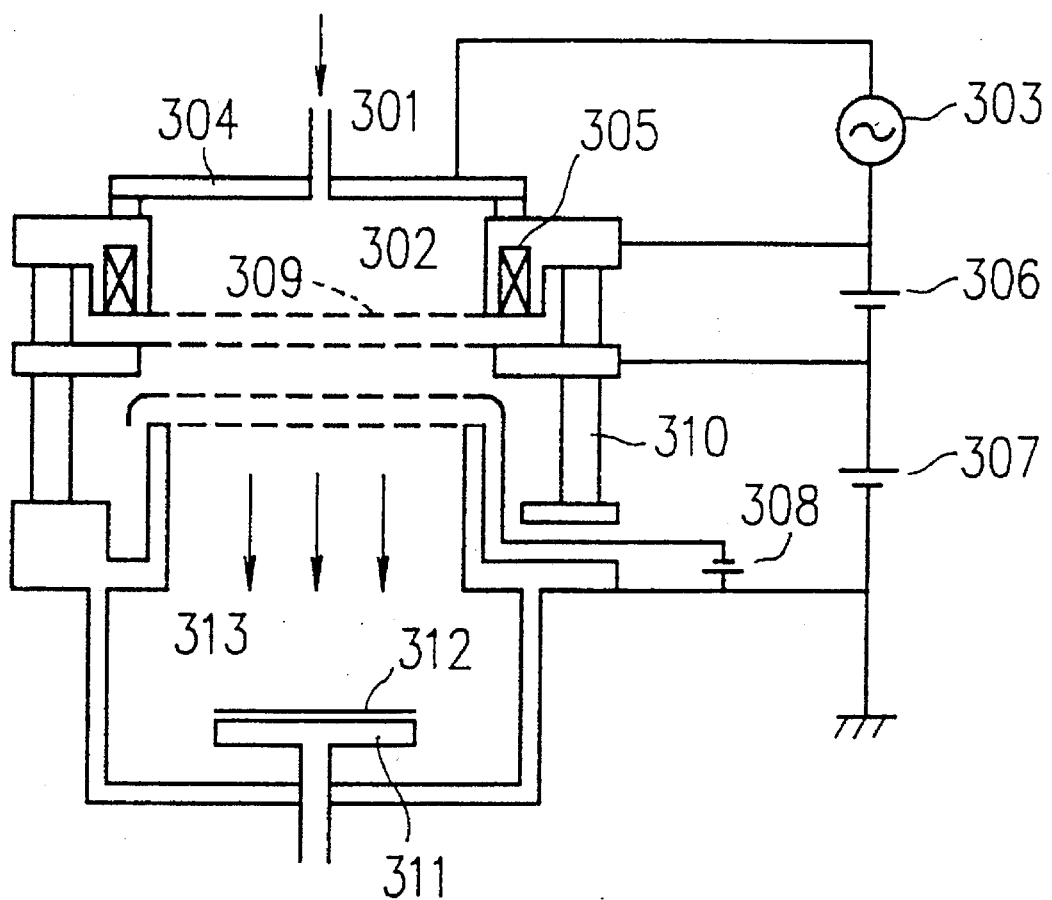
FIG. 3 is a schematic cross-sectional view showing an example of the ion implantation apparatus used in the present invention.

This ion implantation step can be performed using an ion implantation apparatus such as the one shown in FIG. 3. In the ion implantation apparatus shown, a 5% hydrogen diluted PH$_3$ gas introduced through a gas inlet 301 into a chamber 302 is ionized by high-frequency power generated between a high-frequency electrode 304 and one of electrode plates 309 with a high-frequency power supply 303 and a magnet 305. The resulting ions 313 are not subjected to mass separation usually performed in an ion implantation step, but are accelerated by electrode plates 309 held by insulators 310 and connected with a first-stage ion acceleration power supply 306 and a second-stage ion acceleration power supply 307, and a deceleration power supply 308, and thus fed from the plasma source for implantation into a substrate 312 placed on a holder 311.

Next, as shown in FIG. 2E, the capping film 206 formed from silicon oxide or the like is patterned by photolithography to form the insulating protective film 206a.

After that, a thin film of metal such as titanium is deposited, which is then patterned by photolithography to form the source electrode 210a and the drain electrode 210b.

Figure 4:
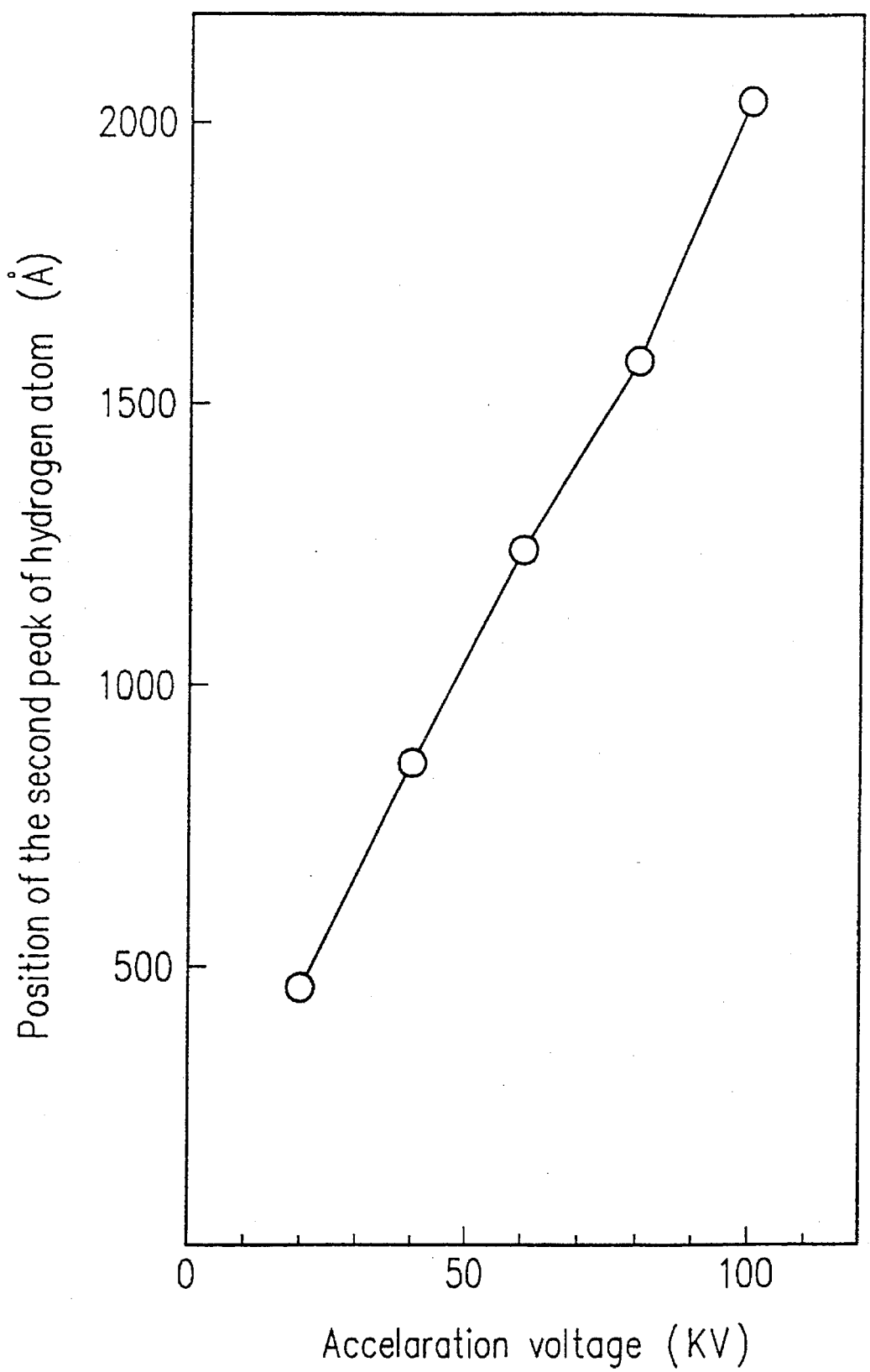
FIG. 4 is a graph showing the relationship between the thickness of a capping film and the acceleration voltage necessary for a second peak of hydrogen ion distribution to reach a semiconductor thin film.

FIG. 4 shows the relationship between the position of the second peak of hydrogen atoms and the acceleration voltage. In the figure, the ion acceleration voltage is plotted along the abscissa and the position of the second peak of the hydrogen atoms in a silicon oxide film is plotted along the ordinate. As can be seen from the figure, the position of the second peak of the hydrogen atoms is approximately proportional to the ion acceleration voltage. For example, when the thickness of the capping film 206 is about 2000 Å, if the acceleration voltage is set at 100 kV, the second peak of the hydrogen atoms appears within the microcrystalline silicon film 205 underlying the capping layer 206; likewise, when the thickness of the capping film 206 is about 1000 Å, if the acceleration voltage is set at 50 kV, the second peak of the hydrogen atoms appears within the microcrystalline silicon film 205. By adjusting the ion acceleration voltage in relation to the thickness of the capping layer 206 in this manner, the position of the second peak of the hydrogen atoms can be brought within the semiconductor film.

Figure 5:
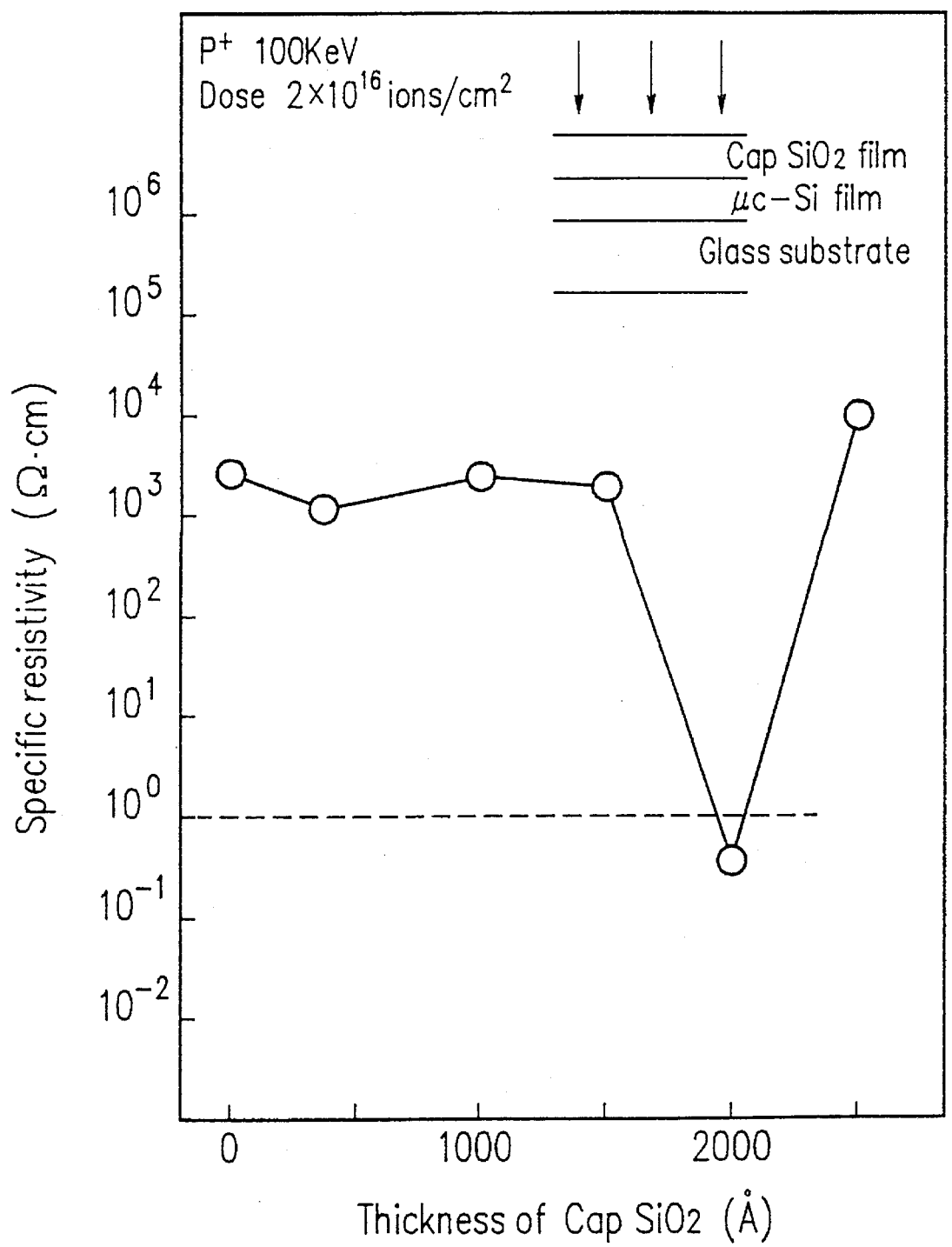
FIG. 5 is a graph plotting the specific resistivity of a microcrystalline silicon film, in which phosphorus ions and hydrogen ions were implanted at acceleration voltage 100 kV and total dose of $2\times10^{16}$ ions/cm$^2$, as a function of the thickness of a capping film formed from silicon oxide.

FIG. 5 is a graph plotting the specific resistivity of the source region 209a and the drain region 209b, which were formed by implanting the phosphorus ions and hydrogen ions 208 at acceleration voltage 100 kV and total dose of $2\times10^{16}$ ions/cm$^2$ but were not subjected to thermal annealing after the implantation, as a function of the thickness of the capping film 206 formed from silicon oxide. As can be seen from the figure, when the thickness of the capping film 206 is within the range of 0 to 1500 Å, the specific resistivity is about $10^3$ Ω·cm, a value as high as that of the corresponding regions formed by implanting ions into an a-Si film. On the other hand, when the capping film thickness is set at about 2000 Å so that the second peak of the hydrogen atoms is positioned within the microcrystalline silicon film 205, the specific resistivity reduces down to $4\times10^{-1}$ Ω·cm. This shows that the source region 209a and the drain region 209b having a low resistance can be obtained by ion implantation only, without subsequent thermal annealing. If the thickness of the capping film 206 is further increased, the specific resistivity increases since the second peak of the hydrogen atoms moves back into the capping film 206.

According to the present embodiment, since ions are implanted at an acceleration voltage of 100 kV through the capping film 206 made of silicon oxide and having a thickness of 2000 Å, the second peak of the hydrogen atoms appears within the semiconductor thin film, which makes it possible to form the source region 209a and the drain region 209b having a low resistance. Furthermore, self-aligned formation of the source region 209a and the drain region 209b contributes to reducing the size of the TFT. Also, the use of the insulating protective film 206 as the capping film makes possible the fabrication of a high-performance TFT without increasing the number of film deposition steps. Moreover, since thermal annealing is not needed after ion implantation, the TFT can be fabricated at low processing temperatures, permitting the use of a large-area glass substrate.

(Embodiment 2)

Figure 6A:
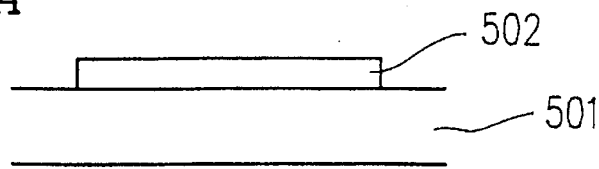
FIGS. 6A to 6E are cross-sectional views illustrating a fabrication process sequence for a TFT according to a second embodiment of the present invention.
Figure 6B:
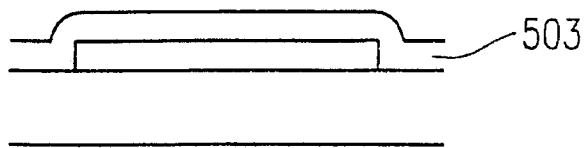
Figure 6C:
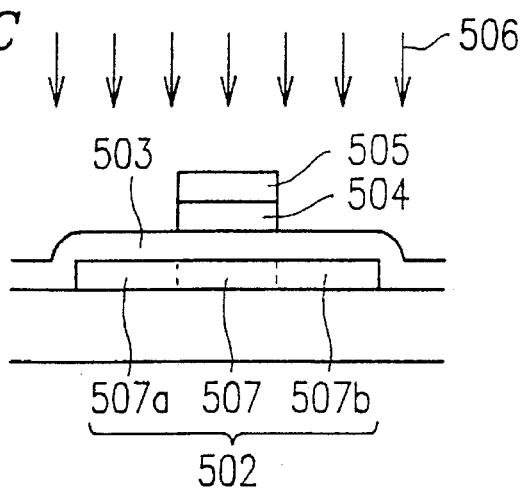
Figure 6D:
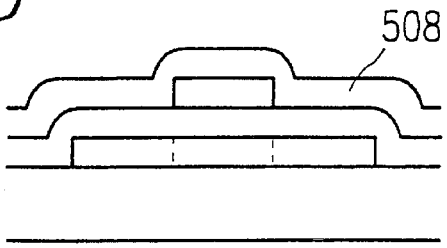
Figure 6E:
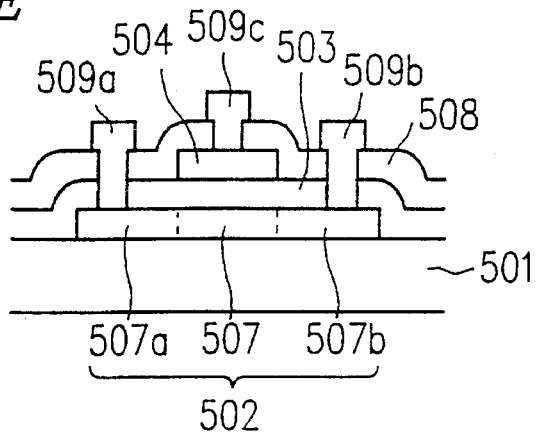

FIG. 6E shows a cross-sectional view of a coplanar TFT fabricated by using a TFT fabrication method according to a second embodiment of the present invention. In this TFT, a microcrystalline silicon film 502, consisting of source and drain regions 507a and 507b doped with impurity ions and a channel region 507 not doped with impurity ions, is formed on a substrate 501. A gate insulating film 503 is formed to cover the microcrystalline silicon film 502. A gate electrode 504 is formed on the gate insulating film 503 opposite the channel region 507. An interlevel insulating film 508 is formed to cover the gate electrode 504.

A source electrode 509a, a drain electrode 509b, and a contact electrode 509c to the gate electrode 504 are formed on the interlevel insulating film 508. The source electrode 509a and the drain electrode 509b are connected to the source region 507a and the drain region 507b, respectively, through the contact holes opened through the interlevel insulating film 508 and the gate insulating film 503, while the contact electrode 509c is connected to the gate electrode 504.

The TFT of the above structure can be fabricated in accordance with the fabrication process sequence shown in FIGS. 6A to 6E.

First, as shown in FIG. 6A, using a hydrogen diluted monosilane gas a microcrystalline silicon film is deposited by plasma CVD with high RF power to a thickness of about 600 Å on the substrate 501 formed from a transparent glass substrate or the like. The deposited film is then patterned by photolithography into a desired shape to form the microcrystalline silicon film 502.

As shown in FIG. 6B, a silicon oxide film or the like is deposited by plasma CVD or by sputtering, to form a capping film 503 having a thickness of 900 Å.

As shown in FIG. 6C, a thin film of metal such as aluminum is deposited, which is then patterned by photolithography into a desired shape to form the gate electrode 504. A portion or the capping layer 503 beneath the gate electrode 504 acts as a gate insulating film.

With the gate electrode 504 exposed, or with the gate electrode 504 topped with a resist pattern 505 as shown in FIG. 6C, phosphorus ions and hydrogen ions 506 are implanted, at an acceleration voltage of 40 kV and a total dose of $2\times10^{16}$ ions/cm$^2$, through the capping film 503 and into the microcrystalline silicon film 502. This ion implantation step can be performed using the ion implantation apparatus shown in FIG. 3. In this ion implantation step, the source region 507a and the drain region 507b made of n-type semiconductor layers are formed in self-alignment with the gate electrode 504. At this time, impurities are not doped into the portion of the microcrystalline silicon film 502 vertically beneath the gate electrode 504; this portion functions as the channel region 507.

Next, an insulating film, such as a silicon oxide film or a silicon nitride film, is deposited to form the interlevel insulating film 508.

As shown in FIG. 6E, a contact hole is opened through the interlevel insulating film 508 down to the gate electrode 504, and contact holes are opened through the interlevel insulating film 508 and the capping film 503 down to the source region 507a and the drain region 507b.

After that, a metal thin film is deposited over the interlevel insulating film 508, with portions of the metal allowed to be filled into the contact holes, thus forming the source electrode 509a, the drain electrode 509b, and the contact electrode 509c to the gate electrode.

According to the fabrication method of the present embodiment, since ions are implanted at an acceleration voltage of 40 kV through the capping film 503 made of silicon oxide and having a thickness of 900 Å, the second peak of the hydrogen atoms appears within the microcrystalline silicon film 502, as can be seen from FIG. 4, thus making it possible to form the source and drain regions 507a and 507b having a low resistance.

Figure 7:
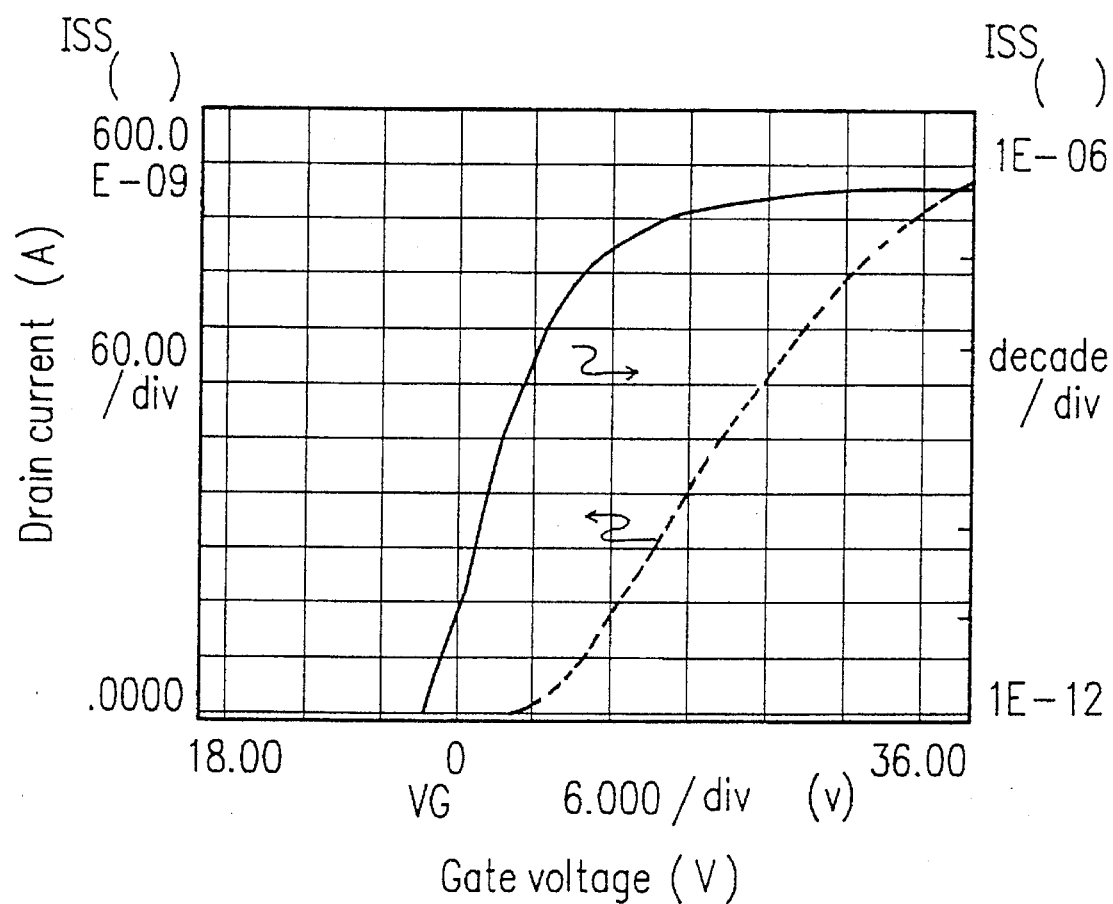
FIG. 7 is a graph showing the gate voltage-drain current characteristic of the TFT of the second embodiment.

FIG. 7 shows the results obtained by measuring the gate voltage-drain current characteristic of the coplanar TFT of the present embodiment. As can be seen, while the field-effect mobility of the conventional TFT is about 0.5 cm$^2$/V·s, the TFT of the present embodiment shows a field-effect mobility as high as 2 cm$^2$/V·s, which improves transistor characteristics.

Furthermore, self-aligned formation of the source and drain regions 507a and 507b contributes to reducing the size of the TFT. Also, since the gate insulating film is used as the capping film 503, a high-performance TFT can be fabricated without increasing the number of film deposition steps. Moreover, since thermal annealing is not needed after ion implantation, the TFT can be fabricated at low processing temperatures, permitting the use of a large-area glass substrate.

(Embodiment 3)

This embodiment is concerned with a liquid-crystal display apparatus in which the coplanar TFT of the second embodiment is used at each pixel site.

Figure 8:
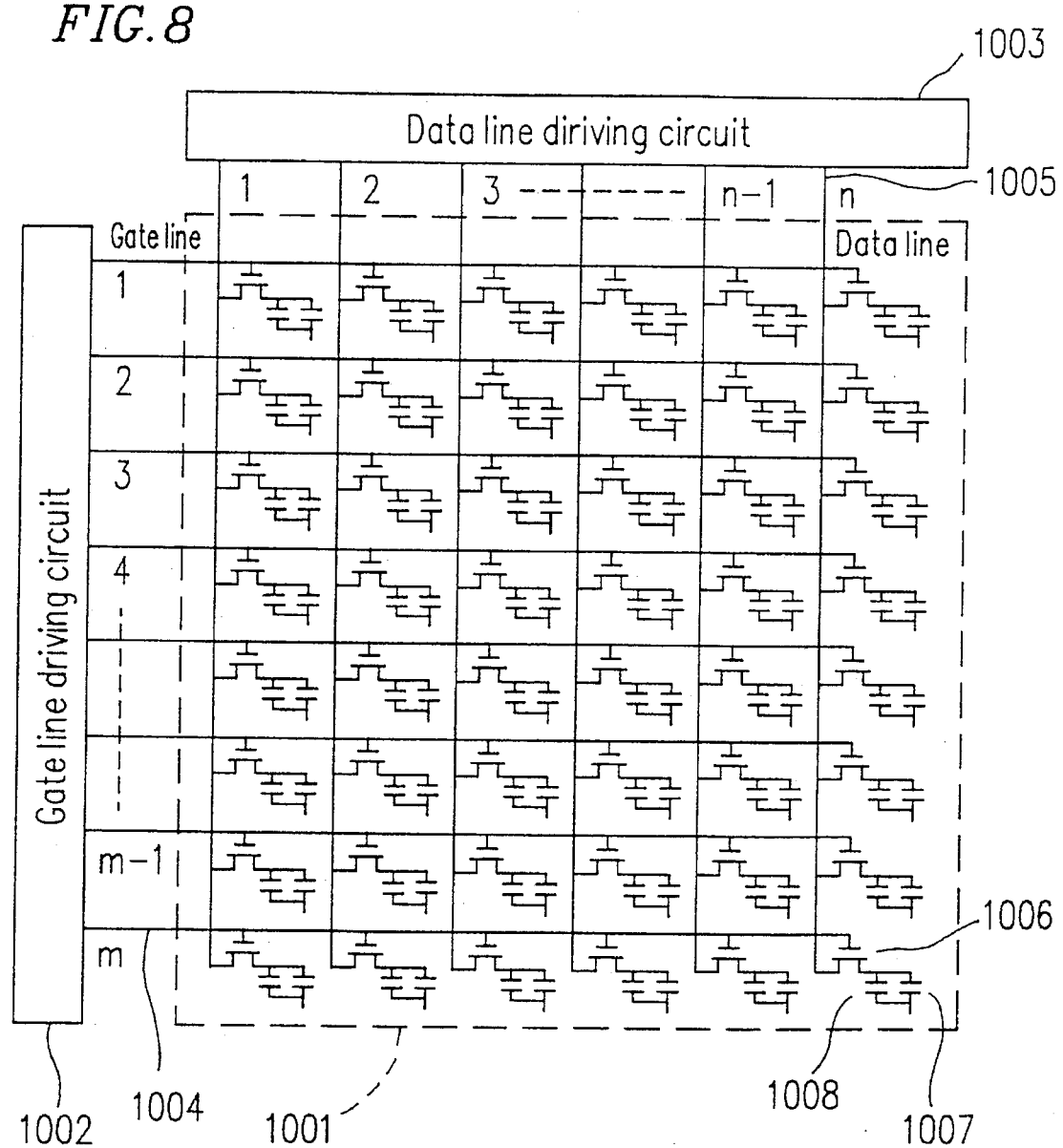
FIG. 8 is a diagram showing the structure of a liquid-crystal display apparatus according to a third embodiment of the present invention.
Figure 9:
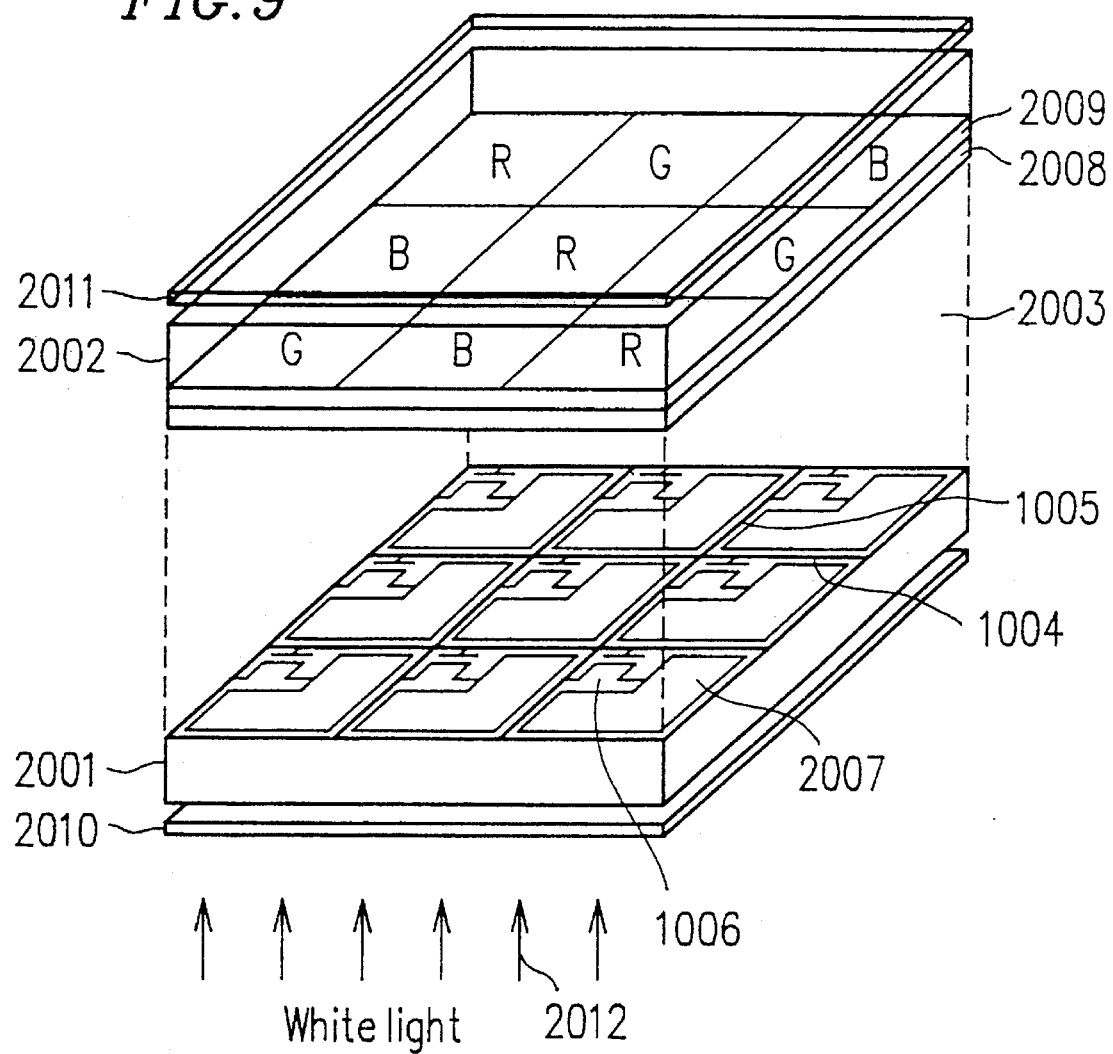
FIG. 9 is a perspective view of a display section in the liquid-crystal display apparatus of FIG. 8.
Figure 10:
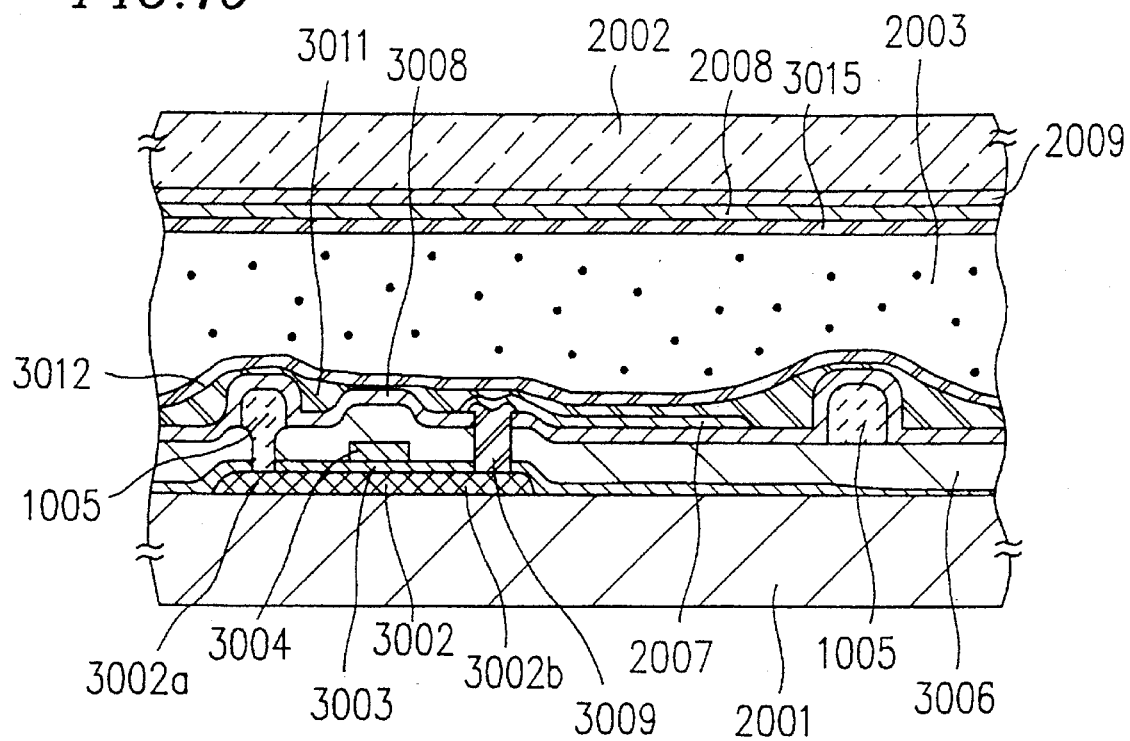
FIG. 10 is a cross-sectional view of the display section in the liquid-crystal display apparatus of FIG. 8.

FIG. 8 is a diagram showing the construction of the liquid-crystal display apparatus of this embodiment, FIG. 9 is a perspective view of a display section, and FIG. 10 is a cross-sectional view of the display section. In the liquid-crystal display apparatus, gate lines 1004 and data lines 1005 are formed intersecting each other in the display section 1001, and near each intersection a TFT 1006 is formed which is connected to a liquid-crystal section 1007 and an auxiliary capacitor 1008. A gate line drive circuit 1002 and a data line drive circuit 1003 are provided on the periphery of the display section 1001 and are connected to the gate lines 1004 and the data lines 1005, respectively. The TFTs 1006, scanning lines 1004, the data lines 1005, and pixel electrodes 2007 are formed on a substrate 2001, and the gate electrode 3004 of each TFT is connected to the adjoining gate line 1004, the source region 3002a to the data line 1005, and the drain region 3002b to the pixel electrode 2007 via a contact buffer metal 3009. Further, a liquid-crystal alignment film 3012 is formed over the substrate 2001. A common electrode 2008, a color filter 2009, and a second liquid-crystal alignment film 3015 are formed on the opposite surface of a counter substrate 2002.

A liquid-crystal layer 2003 is sandwiched between the two substrates to construct a liquid-crystal panel, each pixel (liquid-crystal section 1007) being located between the pixel electrode 2007 and the common electrode 2008. Polarizing plates 2010 and 2011 are provided on both outer sides of the liquid-crystal panel. White light 2012 is projected from the side of the substrate 2001, and transmitted light is displayed.

The TFT 1006 is formed from a semiconductor layer having a source region 3002a, a drain region 3002b, and a channel region 3002, and a gate electrode 3004 formed thereabove across a gate insulating film 3003. An interlevel insulating film 3006 is formed on the gate electrode 3004 and the data line 1005 is further formed on the interlevel insulating film 3006. The data line 1005 is connected to the source region 3002a via a contact hole opened through the interlevel insulating film 3006. On the data line 1005 there is formed a second interlevel insulating film 3008 on which the contact buffer metal 3009 and the pixel electrode 2007 are provided. The pixel electrode 2007 is connected to the drain region 3002b via the contact buffer metal 3009 extending through a contact hole opened through the interlevel insulating film 3006 and second interlevel insulating film 3008. Thereabove is formed a protective film 3011 on which the liquid-crystal alignment film 3012 is formed.

Since the TFTs 1006 used in the display section 1001 have source and drain regions of a low resistance and the field-effect mobility is as high as 2 $cm^2/V \cdot s$, the liquid-crystal display of this embodiment provides a high-resolution display screen. Furthermore, with self-aligned formation of the source and drain regions, the size of the TFT 1006 is reduced, and the numerical aperture of the liquid-crystal display is increased, realizing a bright display screen. Moreover, since the TFT 1006 can be fabricated at low processing temperatures, a large-area glass substrate can be used to achieve a large-area screen.

Although the invention has been described in detail with reference to the preferred embodiments, the invention is not limited to the illustrated embodiments, but various modification may be made in the invention.

In the ion implanation step, a mixture of $PH_3$ gas containing P (phosphorus), a Group V element, and hydrogen gas was used; however, other mixed gases, such as a mixture of $B_2H_6$ gas containing B (boron), a Group III element, and hydrogen gas, may be used. Further, instead of using a mixture of a gas containing the P element as a Group V element and hydrogen gas, a mixture of a gas containing an element other than P as a Group V element (such as an $AsH_3$ gas containing the As element) and hydrogen gas may be used.

It is also possible to use a silicon nitride film or other insulating film as the capping film. Since the projected range of the implanted ions for the same acceleration voltage varies depending on the kind of the capping film, the film thickness is adjusted so that the second peak of the hydrogen ions can be made to exist within the semiconductor thin film. Since the position of the second peak of the hydrogen ions is approximately proportional to the ion acceleration voltage, the film thickness should be adjusted in accordance with the ratio between the projected ranges of the hydrogen ions implanted at the same acceleration voltage into a silicon oxide film and into an insulating film of other material (such as a silicon nitride film). For example, when ions are implanted at an acceleration voltage of 100 kV, the second peak of the hydrogen ions in a silicon oxide film is at about 2000 Å below the film surface. The projected range of 2000 Å corresponds to an acceleration voltage of about 14 kV. When ions are implanted into a silicon nitride film at the acceleration voltage of 14 kV, the projected range is about 1640 Å. Therefore, if the capping film is to be formed from silicon nitride, the film thickness should be set at about 1640 angstroms.

The type of TFT used in the display section of the liquid-crystal display is not limited to the coplanar TFT of the third embodiment, but TFTs of other structures, such as a staggered type or a reverse-staggered type, may be used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of fabricating a thin-film transistor, including the step of forming a source region and a drain region in a semiconductor thin film having a capping film thereon, by accelerating a plasma source including hydrogen ions and one of Group III ions and Group V ions of the Periodic table, and simultaneously implanting the hydrogen ions and one of the Group III ions and the Group V ions into the semiconductor thin film, wherein there exist a plurality of peaks in a depth profile of a concentration of the hydrogen ions implanted into the semiconductor thin film having the capping film thereon and a second peak from a surface of the capping film among the plurality of the peaks is made to exist in the semiconductor thin film.

2. A method of fabricating a thin-film transistor according to claim 1, wherein material and a thickness of the capping film are selected in relation to ion implantation acceleration energy so that the second peak exists in the semiconductor thin film.

3. A method of fabricating a thin-film transistor according to claim 1, wherein an acceleration energy for accelerating the plasma source is determined such that the second peak exists in the semiconductor thin film.

4. A method of fabricating a thin-film transistor according to claim 1, wherein the semiconductor thin film includes a silicon film having a microcrystalline phase.

5. A method of fabricating a thin-film transistor according to claim 4, wherein the thin-film transistor is a reverse-staggered thin-film transistor, and an insulating protective film for the semiconductor thin film is used as the capping film.

6. A method of fabricating a thin-film transistor according to claim 4, wherein the thin-film transistor is a staggered or coplanar thin-film transistor, and a gate insulating film is used as the capping film.

* * * * *